United States Patent [19]

Kornienko et al.

[11] 4,157,494

[45] Jun. 5, 1979

[54] CONTROLLED MULTIDIGIT RESISTANCE BOX

[76] Inventors: Marat I. Kornienko, ulitsa Dugina, 10, kv. 66; Anatoly V. Furman, ulitsa Chkalova, 21, kv. 6; Boris P. Podboronov, ulitsa Molodezhnaya, 30, kv. 50; Vyacheslav V. Shevchuk, ulitsa Stroitelei, 6, kv. 1, all of Zhukovsky Moskovskoi oblasti, U.S.S.R.

[21] Appl. No.: 907,917

[22] Filed: May 22, 1978

[51] Int. Cl.$^2$ .............................................. H03H 7/38
[52] U.S. Cl. ....................................... 323/79; 323/80; 323/94 R
[58] Field of Search ................... 323/74, 79, 80, 81, 323/94 R, 96

[56] References Cited

U.S. PATENT DOCUMENTS

| | | | |
|---|---|---|---|
| 2,999,202 | 9/1961 | Ule | 323/79 |
| 3,590,366 | 6/1971 | Vaughn | 323/74 |
| 3,731,181 | 5/1973 | Cecil et al. | 323/80 |

FOREIGN PATENT DOCUMENTS 1563748  6/1970  Fed. Rep. of Germany ............. 323/80

Primary Examiner—Gerald Goldberg
Attorney, Agent, or Firm—Burgess, Ryan and Wayne

[57] ABSTRACT

According to the invention, each digit of the controlled multidigit resistance box comprises "n" series-connected resistors, an operational amplifier and two switching elements connected to each lead of each resistor. One of the switching elements is connected to the inverting input of the operational amplifier, while the other is connected to the output of the operational amplifier. The resistance box further includes a control unit for selecting a desired combination of resistors, connected to the switching elements of each digit. The center tap of power sources of the operational amplifier of the previous digit is connected to the input of the next digit of the resistance box.

3 Claims, 1 Drawing Figure

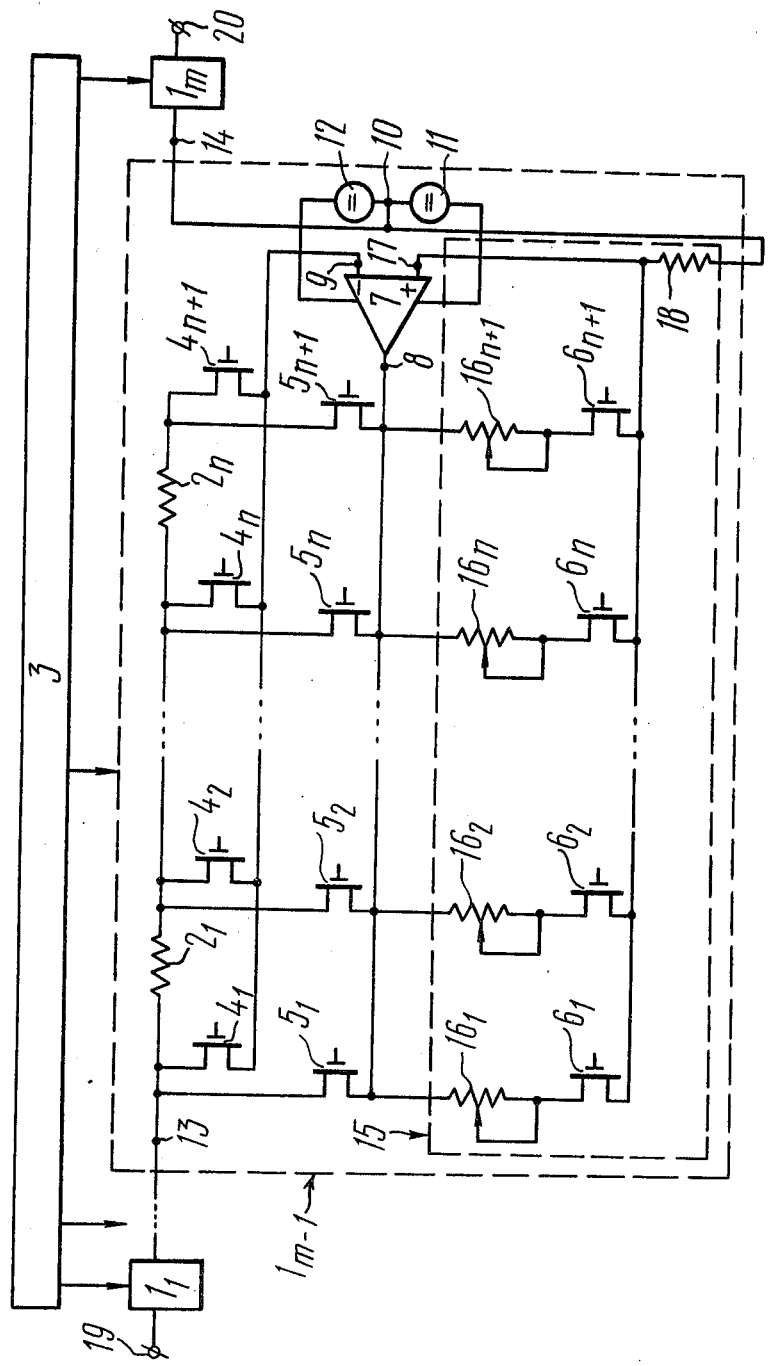

CONTROLLED MULTIDIGIT RESISTANCE BOX

FIELD OF THE INVENTION

The present invention relates to measuring equipment and, more particularly, to controlled multidigit resistance boxes.

The controlled multidigit resistance box according to the invention can be used as a rapid-action controlled multidigit standard resistance device for automatic checking and metrological certification of multichannel measuring devices operating under dynamic conditions.

BACKGROUND OF THE INVENTION

There is known a controlled multidigit resistance box, wherein each digit (decade) comprises ten series-connected resistors. The digits (decades) of the resistance box are interconnected in series via switches. The common lead-out of the switch of each previous decade is connected to the input of the next decade; the contacts of the resistor switch of each decade are connected to any lead-out of each resistor of the decade. The mechanical contact switches may be controlled by a drive coupled to a control unit. A certain position of the switches in each decade corresponds to a specified resistance value.

However, the use of mechanical contact switches in the resistance box under review affects the operating speed of the box and the accuracy of setting a specified resistance value. In addition, the use of such switches necessitates the use of resistors of a high grade of accuracy in each decade.

It is an object of the present invention to increase the operating speed of the resistance box.

It is another object of the invention to provide a resistance box which would ensure a high accuracy of setting a specified resistance value.

It is still another object of the invention to provide a resistance box, wherein resistors of a high grade of accuracy would not be a necessity.

The present invention essentially consists in providing a controlled multidigit resistance box, wherein each digit comprises "n" series-connected resistors and a control unit for selecting a desired combination of resistors, to switching elements of each digit, the resistance box being characterized, according to the invention, in that each digit includes an operational amplifier, and in that each lead-out of any resistor of the "n" series connected-resistors of a digit is connected via one of the switching elements to an output of the operational amplifier, and via another switching element, to the operational amplifier's inverting input, a center tap of power sources of the operational amplifier of the previous digit being connected to the input of the next digit of the resistance box.

Each digit of the resistance box may include a circuit for compensating parametric variations of the resistors.

It is highly desirable that each circuit for compensating parametric variations of resistors should include "n+1" parallel branches, each comprising a potentiometer and a switching element placed in series, and each being interposed between the output of the operational amplifier and its non-inverting input which is coupled via a resistor to the center tap of the operational amplifier's power sources.

The proposed design accounts for an icreased operating speed of the resistance box and a greater accuracy of setting a desired resistance value; as a result, the resistance box according to the invention can be used as a rapid-action standard resistance device for multichannel measuring systems.

Other objects and advantages of the present invention will become more apparent from the following detailed description of a preferred embodiment thereof to be read in conjunction with the accompanying drawing.

Referring to the attached drawing, the controlled multidigit resistance box of this invention comprises "m" digits $1_1, \ldots, 1_{m-1}, 1_m$, each containing "n" series-connected resistors $2_1, \ldots, 2_n$ and a control unit 3 for selecting a desired combination of resistors of each digit, connected via control buses to switching elements $4_1, 4_2, \ldots, 4_n, 4_{n+1}$. $5_1, 5_2, \ldots, 5_n, 5_{n+1}$. $6_1, 6_2, \ldots, 6_n, 6_{n+1}$ of each digit $1_1$ through $1_m$. Each of the "m" digits contains an operational amplifier 7. Each lead-out of any resistor $2_1, \ldots, 2_n$ is connected via one of the switching elements $5_1, \ldots, 5_{n+1}$ to an output 8 of the operational amplifier, and via one of the switching elements $4_1, \ldots, 4_{n+1}$ to an inverting input 9 of the operational amplifier 7. A center tap 10 of power sources 11 and 12 of the operational amplifier 7 of each previous digit is connected to the next digit's input. The input of each digit is a first lead-out 13 of the resistor $2_1$. By way of an example, the attached drawing shows the connection of the $1_{m-1}$-th digit to the $1_m$-th digit; the center tap 10 of the power sources 11 and 12 of the operational amplifier 7 of the $1_{m-1}$-th digit is connected to a first lead-out 14 of the resistor $2_1$ of the $1_m$-th digit. Each of the "m" digits of the resistance box includes a circuit 15 for compensating parametric variations of the resistors $2_1, \ldots, 2_n$.

In turn, each compensation circuit 15 comprises "n+1" parallel branches, each composed of a potentiometer $16_1, 16_2 \ldots, 16_n, 16_{n+1}$ and the switching element $6_1, \ldots, 6_{n+1}$ that are placed in series, and each interposed between the output 8 of the operational amplifier 7 and its non-inverting input 17 which is coupled via a resistor 18 to the center tap 10 of the power sources 11 and 12 of the operational amplifier 7.

The input of the controlled multidigit resistance box according to the invention is a terminal 19 of the first lead-out of the resistor $2_1$ of the first digit $1_1$; the output of the resistance box is a terminal 20 of the center tap 10 of the power source 11 and 12 of the operational amplifier of the $1_m$-th digit.

In the embodiment under review, the switching elements $4_1, \ldots, 4_{n+1}$; $5_1, \ldots, 5_{n+1}$; and $6_1, \ldots, 6_{n+1}$ of each digit $1_1$ through $1_m$ are built around field-effect transistors.

The controlled multidigit resistance box of the present invention operates as follows.

In each of the "m" digits, signals produced by the control device 3 cause a simultaneous closure of those switching elements $4_1, \ldots, 4_{n+1}$; $5_1, \ldots, 5_{n+1}$; and $6_1, \ldots, 6_{n+1}$ which have the same index k, where k is an integer within the range from 1 to (n+1). For each of the digits $1_1$ through $1_m$, k may have a value different from those of other digits. The closure of certain switching elements in each digit $1_1$ through $1_m$ connects a certain number of the series resistors $2_1, \ldots, 2_n$ between the input (the lead 13) and output (the center tap 10 of the power sources 11 and 12) of a given digit. Keeping in mind that the "m" digits of the resistance box are also placed in series, the total value of the resistances selected in each digit is thus found between the input terminal 19 and output terminal 20 of the resistance box, which total resistance is equal to a specified value.

The switching of the lead-outs of the resistors $2_1, \ldots, 2_n$ in each digit $1_1$ through $1_m$ is effected with the aid of an active switching element built around the operational amplifier 7 having the switching elements $4_1, \ldots, 4_{n+1}$ and $5_1, \ldots, 5_{n+1}$ in its negative feedback path and the compensation circuit 15 and resistor 18 in its positive feedback path. Consider, by way of example, the commutation of the second lead-out of the resistor $2_1$. In this case, the switching elements $4_2$, $5_2$ and $6_2$ are closed. Depending on the position of the slide of the potentiometer $16_2$, the contact resistance between the second lead-out of the resistor $2_1$ and the center tap 10 of the power sources 11 and 12 changes from a certain positive value to a certain negative value; hence, one can always select a position of the potentiometer's slide at which the contact resistance value is equal in magnitude and opposite in sign to the parametric variation value of the resistor $2_1$; as a result, the exact resistance value of the resistor $2_1$ is found between the input and output of the digit. The leads of other resistors $2_2, \ldots, 2_n$ of the digit are switched in a similar manner, but the position of the slide of the respective potentiometer $16_1, \ldots, 16_{n+1}$ is selected so as to compensate the total parametric variation of several series-connected resistors $2_1, \ldots, 2_n$. For example, in the case of switching the first lead-out 13 of the resistor $2_1$, the position of the slide of the potentiometer $16_1$ is selected so that the contact resistance is zero.

The use of the rapid-action active switching element accounts for an increased operating speed and accuracy of the controlled multidigit resistance box.

What is claimed is:

1. A controlled multidigit resistance box comprising: a plurality of digits; each of said digits comprising, in turn:

"n" series-connected resistors, each having two leads;

an operational amplifier having an inverting input, a non-inverting input, and an output;

"n+1" pairs of switching elements, each pair switching one of said leads of said "n" resistors;

the first switching element of each pair being connected to one of said leads of a respective resistor and to said inverting input of said operational amplifier; the second switching element of each pair being connected to the second lead of the respective resistor and to said output of said operational amplifier;

power sources of said operational amplifier, interconnected so that they have a center tap;

a control unit for selecting a desired combination of said resistors;

said control unit being connected to said switching elements;

said center tap of said power sources of the operational amplifier of the previous digit being connected to the input of the next digit of the resistance box.

2. A controlled multidigit resistance box as claimed in claim 1, wherein each of said digits includes a circuit for compensating parametric variations of the resistors of a given digit.

3. A controlled multidigit resistance box as claimed in claim 2, wherein said circuit for compensating parametric variations of resistors comprises "N+1" parallel branches, each composed of a potentiometer and a third switching element that are placed in series, and each interposed between said output of said operational amplifier of a given digit and said non-inverting input of said operational amplifier; one more resistor connected to said non-inverting input of said operational amplifier and to said center tap of said power sources of said operational amplifier.

* * * * *